Figure 1:
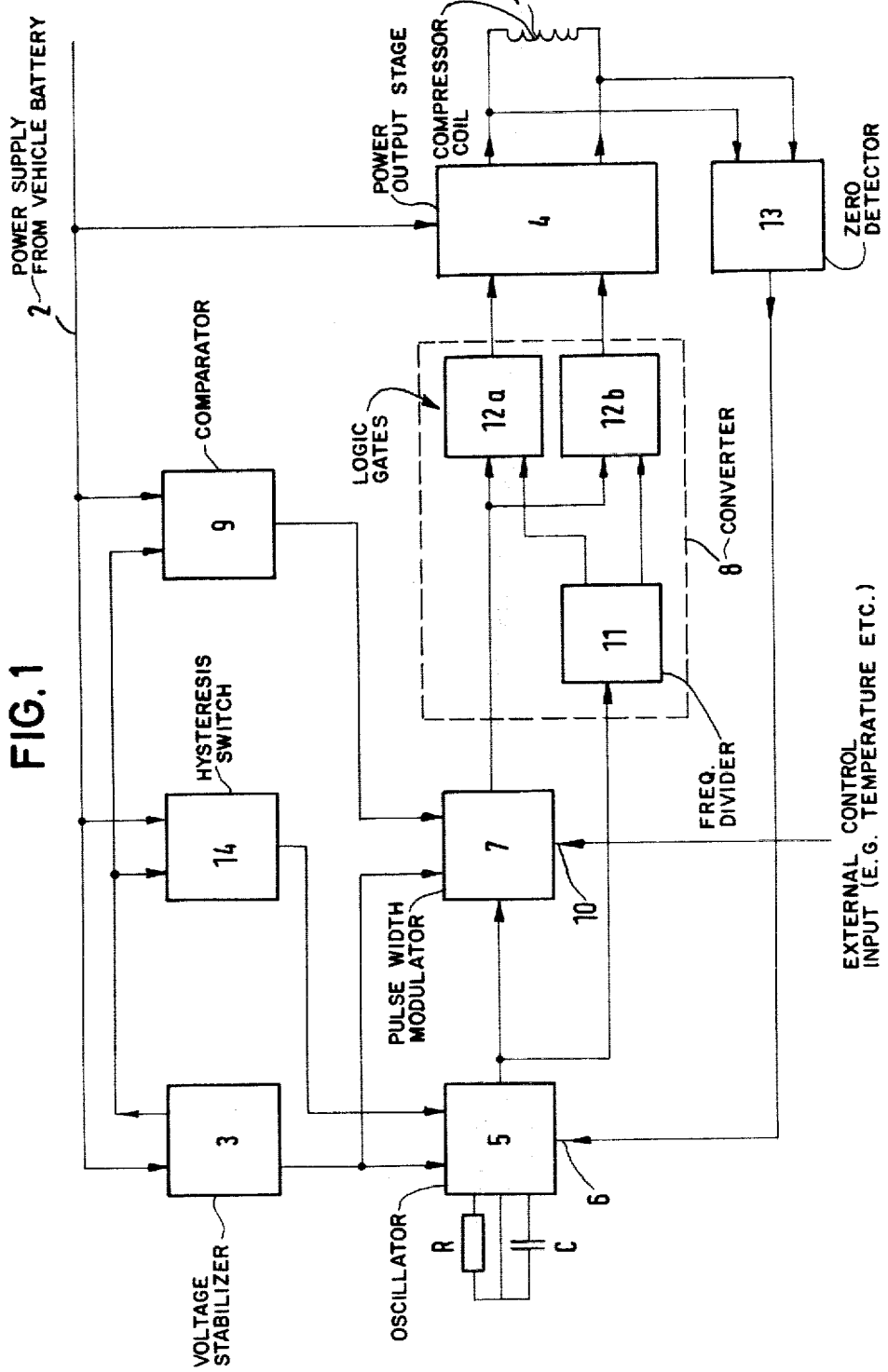

United States Patent [19]

Rabe

[11] 4,309,675

[45] Jan. 5, 1982

[54] CONTROL CIRCUIT FOR PROVIDING A SYNCHRONIZED DRIVE SIGNAL TO AN OSCILLATING SYSTEM

[75] Inventor: Erich Rabe, Nuremberg, Fed. Rep. of Germany

[73] Assignee: Siegas-Metallwarenfabrik Wilhelm Loh GmbH & Co. KG, Siegen, Fed. Rep. of Germany

[21] Appl. No.: 89,289

[22] Filed: Oct. 30, 1979

[30] Foreign Application Priority Data

Oct. 30, 1978 [DE] Fed. Rep. of Germany ....... 2847208

[51] Int. Cl.³ .............................................. H03L 1/00
[52] U.S. Cl. .................................... 331/172; 331/154; 331/175; 318/127
[58] Field of Search ........................ 331/154, 156–158, 331/172, 173, 116 M, 175, 1 R; 318/127, 129

[56] References Cited

U.S. PATENT DOCUMENTS 3,447,051  5/1969  Atwood et al. ...................... 318/127
3,659,968  5/1972  Thomas, Jr. et al. ........... 318/127 X
3,921,386  11/1975  Keller ........................ 331/116 M X

*Primary Examiner*—Siegfried H. Grimm
*Assistant Examiner*—Edward P. Westin
*Attorney, Agent, or Firm*—Craig and Antonelli

[57] ABSTRACT

A control circuit is provided for controlling operation of an electrical or electromechanical system which oscillates at a basic frequency, such as a coil-operated compressor of a vehicle cooling system.

The control circuit has a power output stage which feeds operating power to the oscillating system, and a generator which drives the power output stage and is synchronized with the oscillating system.

The generator comprises an oscillator which produces a pulse sequence at twice the basic frequency of the oscillating system and a converter which modifies the pulse sequence of the oscillator so that every second pulse fed to the power stage has the same polarity. Feedback from the oscillating system is applied to an input of the oscillator to synchronize the oscillator with the oscillating system.

13 Claims, 2 Drawing Figures

CONTROL CIRCUIT FOR PROVIDING A SYNCHRONIZED DRIVE SIGNAL TO AN OSCILLATING SYSTEM

The invention concerns a control circuit, for an electrical or electromechanical system capable of oscillating at a basic frequency, having an electrical oscillation generator capable of being synchronised with the oscillation system and a power stage which supplies the oscillation system and is controlled by the oscillation generator.

Control circuits of this type generate a periodic electrical signal of suitable frequency with the necessary power to induce an oscillation system to maintain oscillation. There are many different types of electrical or electromechanical oscillation systems which can be used. The invention, however, refers in particular to such systems which are provided with a coil within the field of a magnet, which coil oscillates when an a.c. current flows through same. For this purpose the coil or, more seldom, the magnet, is flexibly mounted and connected to a device to be driven by the oscillation system. The basic frequency is the mechanical resonance frequency of the oscillation system and the device connected to it. With the aim of achieving ideal efficiency, the signal generator and the oscillation system are synchronized so that oscillation control occurs at the correct frequency and in phase. This applies in particular to mobile applications in which only a restricted amount of electrical energy is available. This is of special importance in one particular application for which the invention is mainly intended, i.e. for oscillating compressors such as are used for example in vehicle cooling systems. In this application the coil of the oscillation system is connected to the piston of a compressor and supported by a spring attached to a common sealed casing which encloses the complete system. The resonance frequency of the oscillation system coupled to the compressor depends on various factors, for example temperature, pressurization of the compressor, pressures at the in-and-out feed side of the compressor etc. and is therefore not constant. Because of the limited capacity of the vehicle battery with which such a compressor is operated, optimal efficiency must be achieved and therefore synchronization is necessary.

An existing control circuit for such an oscillating compressor (see U.S. Pat. No. 3,659,968) is mainly constructed as a self-oscillating inverter circuit which does not permit synchronization.

In addition there exists a control circuit of the above described general type (see DE-AS No. 25 14 016) in which the coil is included in the oscillation generator. In this case synchronization is achieved by using the voltage induced by the coil to control the power stage. Although the generator frequency changes according to the basic frequency, the accuracy of synchronization is unsatisfactory.

An object of the invention is to provide a control circuit as described above but extended to achieve accurate and reliable synchronization under different operating conditions.

According to the invention therefore there is provided a control circuit of the type described which has an oscillator which can be synchronized by means of an external synchronizing signal which is fed in through a synchronizing input and which generates a sequence of oscillator pulses at an oscillator frequency which corresponds to twice the basic frequency, and a converter which supplies the power stage with every second oscillator pulse at the same polarity, the feedback from the oscillation system being coupled to the synchronizing input of the oscillator. The oscillator provided in the circuit of the invention generates its own oscillator pulse on the basis of the given frequency relationship for each half cycle of the basic frequency of the system. The oscillator pulses are transmitted through the converter to the power stage. An impulse is applied to the oscillating system during all half cycles of one polarity. Thus, for example, the connection terminal of the oscillator coil may be connected back to the synchronizing input of the oscillator so that the next oscillator pulse is triggered exactly according to the momentary phase position of the oscillation system.

It is fundamentally sufficient for controlling the oscillation system that, as described above, control pulses are only generated during the half cycles of one phase position, i.e. only every second oscillator pulse is transmitted with uniform polarity and the interim oscillator pulses are excluded. One should, however, preferably use all oscillator pulses and thus supply them to the power stage through the converter with alternating opposite polarity so that during each half cycle of the system oscillation a pulse of the correct polarity reaches the oscillation system.

The off-load frequency of the oscillator, i.e. the frequency at which it oscillates when there is no synchronizing signal, is preferably below twice the lowest basic frequency. This guarantees that the oscillator does not "catch up with" the pulses of the synchronizing signal, so that the required control range is available under all operating conditions.

A particularly advantageous possibility for synchronizing is found if the synchronizing signal consists of a sequence of zero pulses generated by a zero detector connected to the oscillation system. This makes use of the fact that in the control circuit of the invention the control signal consists of a sequence of discreet pulses of uniform or alternating polarity, whereby between adjacent pulses the control signal reaches more or less exactly zero. Zero pulses, as referred to herein are pulses generated by the zero detector and which have a finite value exactly when the control signal reaches zero. Such a zero detector can for example consist of a so-called operational amplifier connected across diodes to the input terminals of the oscillator coil and which only produces a finite signal if its input signal is generally zero and which otherwise would be completely overdriven.

The feedback required from the oscillator system to the oscillator, as required for synchronization, is produced here by the fact that the position of the interval in which the signal on the oscillation system is zero depends on the induced voltage. As a result, a phase shift in the oscillation system leads to a shift of the zero pulses, which in the sense of control results in a corresponding time shift of the oscillator pulses. For this, the oscillator is preferably triggered by the fall-off flanks of the zero pulses.

The amplitude and width of the oscillator pulses amplified by the power stage are decisive for the electrical energy supplied to the oscillation system. In practice, in particular in mobile applications supplied from a battery, considerable fluctuation of the power stage supply voltage must be expected. This leads to undesired fluctuations of the pulse amplitude and therefore of the electrical supply energy. This could be cancelled out by stabilizing the power stage supply voltage but this results in excessive electrical energy costs and requirements. It is therefore recommended that the power stage should be supplied by an unstabilized supply voltage and instead the width of the oscillator pulses, i.e. the scanning ratio of the oscillator output signal should be varied accordingly in order to increase the pulse width as the supply voltage decreases. In this respect the invention shows in a particularly advantageous configuration that a pulse width modulator is connected after the oscillator so that the width of the oscillator pulses is variable in reverse relation to the power stage supply voltage. In this it is particularly important that the changes in the pulse width caused by the control as a result of the synchronization described above do not lead to a shift of the control pulses in relation to the oscillation of the system. The synchronization as described above can ensure that in-phase control is also possible even if the pulse width changes.

The pulse width modulator should be connected between the oscillator and a logic gate. A further embodiment incorporates a voltage stabiliser and a comparator, whereby at least the oscillator and pulse width modulator are supplied by the stabiliser output voltage, whereby in the comparator the supply voltage of the power stage (i.e. normally the supply voltage of the complete circuit) is compared to the stabilizer output voltage and the comparator output voltage is fed to the pulse width modulator and whereby the width of the oscillator pulses is modulated by the pulse width modulator according to the comparator output voltage. Such modulator circuits operate for example with linearly decreasing sawtooth pulses and are already known, so that no further description is necessary. It is further recommended that the pulse width modulator should be provided with at least one external control input so that the width of the oscillator pulses can be varied according to one or more additional measurement values (for example, for outside temperature, load changes, etc.). It is also possible to provide a hysteresis switch connected to the comparator, which shuts off the oscillator when the power stage supply voltage drops below a predetermined value so that the complete circuit is switched off and the battery is therefore not discharged beyond a predetermined level.

The converter which in the manner described above transmits the oscillator pulses to the power stage is preferably fitted with a frequency divider which halves the frequency of the oscillator output signal, and with at least one logic gate, whereby the undivided oscillator output signal (i.e. oscillating at the original oscillator frequency) is gated with the pulses of the divider output signal. The gating is done such that a pulse occurs at the gate output exactly whenever both an oscillator pulse and a pulse of the divider output signal are present at the gate inputs. Because of frequency division the frequency of the divider output signal corresponds to the basic frequency. As a result a pulse of the logic gate output signal is generated on every oscillation of the oscillating system and therefore during every oscillation at least one control pulse is applied to the oscillation system, always in the same half cycle, positive or negative. In preference however a control pulse of the applicable polarity is produced on each half cycle of the oscillation system. For this purpose there are two logic gates, whereby gating is carried out in the first phase position of the divider output signal and with reverse polarity in the second phase position of the divider output signal, following the first phase position at an interval of 180°. Thus there are two gated outputs whose pulses have a relative displacement of 180° based on the basic frequency. Polarity reversal of one of the gate outputs can be carried out separately by means of a reversal stage. It is also however possible to design the power stage with separate inputs for the logic gates and so that the polarity of the output signal from one of the logic gates is reversed in the power stage. The power stage, for example designed as a push-pull bridge circuit, is constructed so that it is completely blocked when there are no control pulses apart from the unavoidable residual currents, i.e. so that it operates in a so-called C circuit. This reduces the load of the supply voltage to a minimum and achieves ideal efficiency. The logic gates can quite simply be AND gates or NAND gates.

Figure 2:
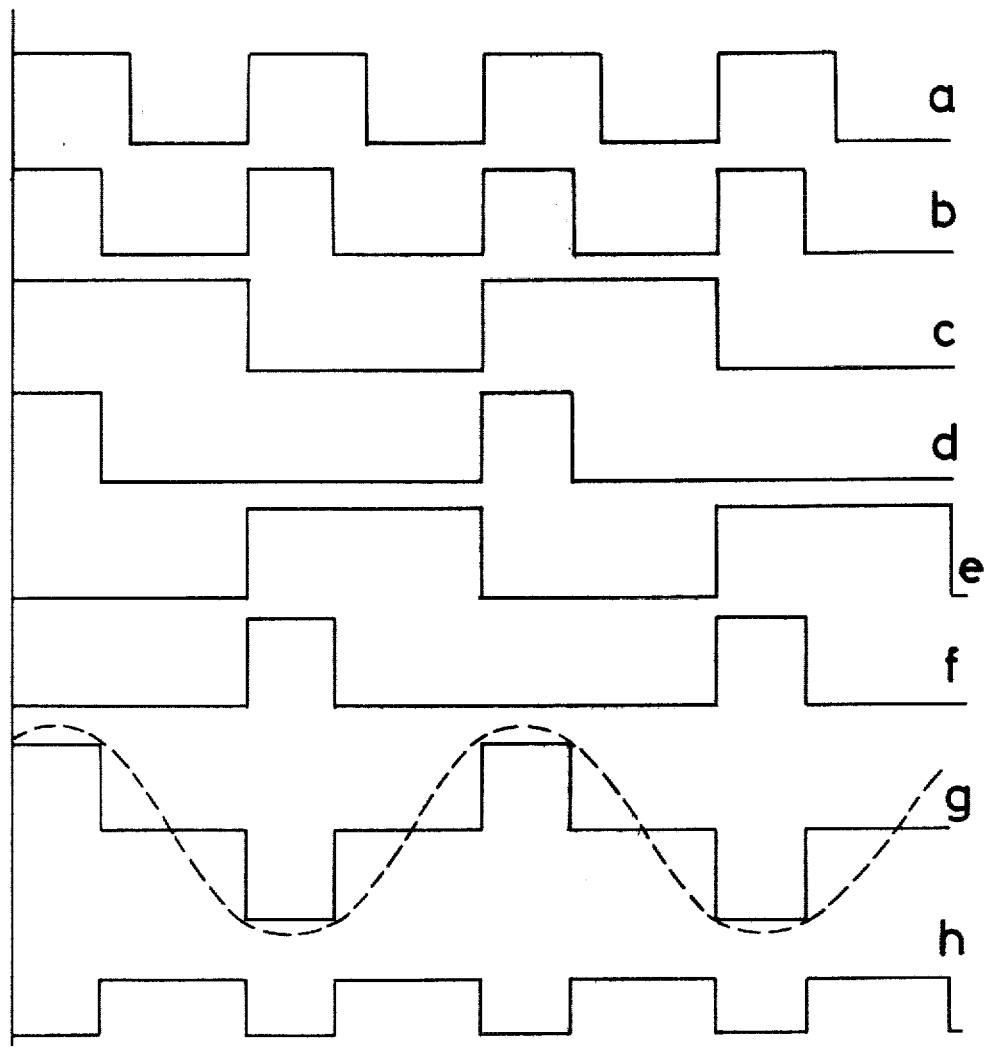

The invention will now be described further by way of example only and with reference to the accompanying drawings in which:

FIG. 1 is a block diagram of a control circuit for an oscillating compressor in accordance with one embodiment of the invention; and FIG. 2 is a simplified illustration of the signals at various points of the circuit according to FIG. 1.

The circuit shown in FIG. 1 serves to control the coil 1 of a compressor (not otherwise shown). The coil is therefore a part of the oscillating system which oscillates at a basic frequency f depending on the operating conditions. The supply voltage fed through a lead 2 from a vehicle battery (not shown) supplies directly a voltage stabilizer 3 and a power stage 4. The stabilized output voltage of the stabilizer supplies an oscillator 5 which can be synchronized by an external signal fed into the synchronizing input 6, also a pulse width modulator 7 and a converter 8. If there is no synchronizing signal the oscillator oscillates according to its RC components at an off-load frequency below twice the basic frequency f, and with a closed control circuit, i.e. under synchronization, at exactly twice the basic frequency f. The oscillator output signal of the frequency $2f$ consists of square wave pulses which in the example shown have a width of 180° according to a scanning ratio of 0.5 and is fed to the pulse width modulator 7 so that the width of the oscillator pulses can be controlled in reverse relationship to the supply voltage of the power stage 4. For this purpose the pulse width modulator is supplied on the one hand with the output voltage of the voltage stabilizer 3 and on the other hand with the output signal of a comparator 9 which compares the momentary supply voltage of the power stage (i.e. of the complete circuit) to the output voltage of the voltage stabilizer. The pulse width modulator operates with linearly decreasing sawtooth pulses which cut off the oscillator pulses sooner or later, depending on the ratio between the supply voltage and the stabilizer output voltage. As a result, the integral of the control pulses on the output of the power stage is constant, irrespective of supply voltage fluctuations. In addition the pulse width modulator is fitted with an external control input 10 through which the width of the oscillator pulses can be varied according to additional measurement values for outside temperature, compressor operating conditions etc.

From the output of the pulse width modulator 7 the oscillator pulses are fed to the converter 8 which mainly consists of a frequency divider 11 and two logic gates 12. The frequency divider halves the frequency of the oscillator pulses coming directly from the output of the oscillator 5, by-passing the pulse width modulator 7. The frequency divider 11 has two outputs, the pulses of which have a relative phase displacement of 180° and are each fed to one of the two logic gates 12a, 12b where they are gated with the output pulses of frequency 2f from the pulse width modulator 7.

The pulses which are present at the logic gate outputs thus have the pulse width present at the output of the pulse width modulator, are present at the basic frequency f and have a relative shift of 180° between the output of the two logic gates (based on the basic frequency f). The output signals of the logic gates 12a, 12b are each fed to an input of the power stage 4 whereby in addition one of the two output signals from the logic gates is reversed in polarity. The polarity reversal can also be carried out by means of a special reversal stage, depending on the design of the power stage. In the example shown the power stage is constructed as a push-pull bridge circuit which reverses the polarity of one of the two input signals. At the output of the power stage to which the coil is connected an output signal is therefore created which consists generally of pulses of alternating polarity and which are each separated from each other by a more or less wide zero interval according to the effect of the pulse width modulator. A zero detector 13 is connected to the power stage output and its output signal is applied to the synchronizing input 6 of the oscillator 5. The zero detector is constructed so that at its output a signal with a finite, predetermined level is produced exactly whenever the input signal is generally zero, i.e. apart from minor variations, while input signals of a finite value overdrive the zero detector and result in output signals which are isolated and not transmitted further. The description given above shows that for each period of the basic frequency f two such zero pulses are produced. The oscillator 5 is designed so that it is triggered by the fall-off flank of the zero pulses supplied to the synchronizing input 6 and produces a further oscillator pulse when the frequency reaches 2f.

In addition a hysteresis switch 14 is provided which compares the supply voltage to the output voltage of the voltage stabilizer 3 and shuts off the oscillator if the supply voltage drops below a certain value.

FIG. 2 shows a simplified illustration of the signal form at various points in the above circuit. FIG. 2a shows the oscillator pulses at the output of the oscillator at a frequency of 2f and at a scanning ratio of 0.5. FIG. 2b shows the pulse form at the output of the pulse width modulator. One can see how the pulse width has been reduced in comparison to the output of the oscillator. FIGS. 2c and 2e show the pulses at the output of the frequency divider. The pulses of both outputs are at half the oscillator frequency, i.e. at the basic frequency f, and have a relative phase displacement of 180°. The result of gating these pulses with the output signals of the pulse width modulator, i.e. the signal on the output of the two logic gates 12a, 12b, is shown in FIGS. 2d and 2f. One can recognize two pulse sequences of the basic frequency f with a relative phase shift of 180° and a pulse width corresponding to the pulse width modulator, which are fed to the inputs of the power stage. The signal at the output of the power stage is shown in FIG. 2g and consists mainly of the superimposition of the pulse sequences shown in FIGS. 2d and 2f, with opposite polarity, whereby there is a zero interval between two adjacent pulses.

The output signal from the zero detector, shown in FIG. 2h, consists mainly of a sequence of zero pulses which reach a finite value precisely during the zero interval according to FIG. 2g and which trigger the oscillator with their fall-off flank.

FIG. 2g shows additionally a very simplified illustration of the oscillation of the system as a sinusoidal curve, in particular of the coil 1 in this example. One can see how the output pulses of the power stage each fall symmetrically in the half cycles of coil oscillation. When, for example, a phase shift between this oscillation and the output pulses of the power stage is caused by a change in the load of the oscillating compressor, the voltage induced through the coil 1 leads to a phase shift of the zero pulses and therefore within the framework of control results in a shift of the trigger point of the oscillator, with the result that in-phase control of the coil, required for achieving ideal efficiency, is again possible.

I claim:

1. A control circuit, for controlling an oscillating system capable of oscillating at a basic frequency, said control circuit having an electrical oscillation generator capable of being synchronized to the oscillating system, and a power stage controlled by the oscillation generator for supplying operating power to the oscillating system, wherein said generator comprises:
   an oscillator which includes an input for receiving an external synchronizing signal and which generates an oscillator pulse sequence at an oscillator frequency corresponding to twice the basic frequency and synchronized with said basic frequency;
   a converter coupled to said oscillator for providing to said power stage a first output pulse sequence comprised of a first set of alternate oscillator pulses with the same polarity; and
   feedback means coupled between the oscillating system and the synchronizing input of the oscillator for synchronizing said oscillator to the basic frequency.

2. A control circuit according to claim 1, wherein said converter further provides to said power stage a second output sequence comprised of a second set of alternate oscillator pulses interspaced between said pulses of said first set of alternate oscillator pulses and having opposite polarity to said first set.

3. A control circuit according to claim 1, wherein the oscillator off-load frequency when no synchronizing signal is provided is below twice the lowest basic frequency of said oscillating system.

4. A control circuit according to claim 1, wherein the synchronizing signal consists of a sequence of zero pulses which have a finite value exactly when the control signal reaches zero, said zero pulses being produced by a zero detector connected to the oscillation system.

5. A control circuit according to claim 4, wherein the oscillator is triggered by a fall-off slope of the zero pulses.

6. A control circuit according to claim 1, wherein a pulse width modulator is connected between the oscillator and the converter so that the width of the oscillator pulses can be controlled in a reverse relationship to a supply voltage of the power stage.

7. A control circuit according to claim 6, further comprising a voltage stabilizer coupled between a supply voltage source and said oscillator, and a comparator coupled to receive the stabilizer output voltage and the supply voltage, whereby the supply voltage of the power stage is compared to the stabilizer output voltage in the comparator and a comparator output voltage is applied to the pulse width modulator so that the pulse width modulator modulates the width of the oscillator pulses in accordance with the comparator output voltage.

8. A control circuit according to claim 6, wherein the pulse width modulator has at least one external control input through which the width of the oscillator pulses can be varied according to one or more additional measurement values.

9. A control circuit according to claim 7, further comprising a hysteresis switch connected to the supply voltage and the output of said voltage stabilizer, wherein said hysteresis switch shuts off the oscillator if the supply voltage of the power stage falls below a predetermined value.

10. A control circuit according to claim 1, wherein the converter includes a frequency divider coupled to receive said oscillator output and to halve the frequency of the oscillator output signal, and with at least one logic gate coupled to receive undivided oscillator output signals and output pulses of the frequency divider to provide a logic output signal to said power stage.

11. A control circuit according to claim 10, wherein a pair of logic gates are provided for producing logic output signals in a first phase position of the divider output signal and also with polarity reversal in a second phase position of the divider output signal, the relative displacement between the two phase positions being 180°.

12. A control circuit according to claim 10, wherein the logic gates each comprises a NAND gate.

13. A control circuit according to claim 1, further comprising means for blocking the power stage if there are no control pulses present other than unavoidable residual currents.

* * * * *